United States Patent
Koo et al.

(10) Patent No.: US 10,760,848 B2
(45) Date of Patent: Sep. 1, 2020

(54) REFRIGERATOR WITH A HEAT DISSIPATION DUCT FOR DISSIPATING HEAT GENERATED BY A DISPLAY

(71) Applicant: SAMSUNG ELECTRONICS CO., LTD., Suwon-si, Gyeonggi-do (KR)

(72) Inventors: Dong Won Koo, Seoul (KR); Sung Mo Kim, Ansan-si (KR); Po Cheon Kim, Suwon-si (KR); Sang Cheol Lee, Bucheon-si (KR); Oun Gu Lee, Seoul (KR); Woo Chul Cho, Suwon-si (KR); Sun Hwan Joo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/250,384

(22) Filed: Jan. 17, 2019

(65) Prior Publication Data

US 2019/0145694 A1    May 16, 2019

Related U.S. Application Data

(63) Continuation of application No. 15/955,440, filed on Apr. 17, 2018, now Pat. No. 10,215,472, which is a
(Continued)

(30) Foreign Application Priority Data

Jul. 28, 2016    (KR) .................. 10-2016-0096483

(51) Int. Cl.
*F25D 23/00*    (2006.01)
*F25D 23/02*    (2006.01)
(Continued)

(52) U.S. Cl.
CPC ........... *F25D 23/003* (2013.01); *F25D 23/02* (2013.01); *F25D 23/028* (2013.01); *F25D 23/06* (2013.01);
(Continued)

(58) Field of Classification Search
CPC .......... H05K 7/20954; H05K 7/20963–20972; F25D 23/028; F25D 23/003;
(Continued)

(56) References Cited

U.S. PATENT DOCUMENTS 7,143,599 B2    12/2006   Wo
7,155,923 B2     1/2007   Nam
(Continued)

FOREIGN PATENT DOCUMENTS

CN    102564054       7/2012
DE    102004027005    2/2005
(Continued)

OTHER PUBLICATIONS

Korean Office Action dated Mar. 10, 2019 in Korean Patent Application No. 10-2018-0034368.
(Continued)

*Primary Examiner* — Zachary Pape
(74) *Attorney, Agent, or Firm* — Staas & Halsey LLP

(57) ABSTRACT

Provided herein is a refrigerator with an improved coupling structure of a heat dissipation duct for dissipating heat generated in a display unit and having and applying the improved heat dissipation duct to a door having a thin thickness such that a problem in which a curve is generated at an exterior of a door when an inside of the door is filled with a heat insulating material is prevented. The refrigerator includes a main body, and a door, wherein the door includes a door cap coupled to at least one of an upper portion and a lower portion of the door, a display unit provided at a front (Continued)

surface of the door, a heat dissipation cover arranged behind the display unit, and a heat dissipation duct slidably inserted into the door through the at least one of the upper portion and the lower portion of the door.

6 Claims, 10 Drawing Sheets

Related U.S. Application Data continuation of application No. PCT/KR2017/005400, filed on May 24, 2017.

(51) Int. Cl.
*H05K 7/20* (2006.01)
*F25D 29/00* (2006.01)
*F25D 23/06* (2006.01)
*F25D 27/00* (2006.01)

(52) U.S. Cl.
CPC ............ *F25D 27/00* (2013.01); *F25D 29/00* (2013.01); *F25D 29/005* (2013.01); *F25D 2323/0021* (2013.01); *F25D 2323/02* (2013.01); *F25D 2400/36* (2013.01); *F25D 2400/361* (2013.01); *H05K 7/20972* (2013.01)

(58) Field of Classification Search
CPC ......... F25D 2323/0021; F25D 2400/36; F25D 2600/04; F25D 2323/02
USPC ................ 361/679.46–679.54, 688–723; 165/80.1–80.5, 104.33
See application file for complete search history.

(56) References Cited

U.S. PATENT DOCUMENTS

| | | | |
|---|---|---|---|
| 9,958,199 | B2 | 5/2018 | Koo |
| 10,215,472 | B2* | 2/2019 | Koo ..................... F25D 29/005 |
| 2004/0259492 | A1 | 12/2004 | Suzuki |
| 2005/0097912 | A1 | 5/2005 | Nam et al. |
| 2006/0180295 | A1* | 8/2006 | Lee ..................... F24F 12/006 165/53 |
| 2007/0056303 | A1 | 3/2007 | Choi |
| 2016/0209110 | A1* | 7/2016 | Cho ..................... F25D 23/062 |
| 2017/0261248 | A1 | 9/2017 | Koo |

FOREIGN PATENT DOCUMENTS

| | | |
|---|---|---|
| DE | 102006042542 | 3/2007 |
| EP | 2843330 | 3/2015 |
| JP | 9-250868 | 9/1997 |
| JP | 2001-153538 | 6/2001 |
| KR | 10-2005-0044169 | 5/2005 |
| KR | 10-2005-0063527 | 6/2005 |
| KR | 10-2006-0035428 | 4/2006 |
| KR | 10-2007-0030643 | 3/2007 |
| KR | 10-2008-0004741 | 1/2008 |
| KR | 10-2012-0049585 | 5/2012 |
| KR | 10-1639522 | 7/2016 |
| WO | 2017/039186 | 3/2017 |

OTHER PUBLICATIONS

Korean Notice of Allowance dated Apr. 19, 2019 in Korean Patent Application No. 10-2018-0034368.
Extended European Search Report dated Jul. 17, 2019 in European Patent Application No. 17794210.9.
International Search Report dated Aug. 17, 2017 in corresponding International Patent Application No. PCT/KR2017/005400.
Written Opinion of the International Searching Authority dated Aug. 17, 2017 in corresponding International Patent Application No. PCT/KR2017/005400.
Korean Office Action dated Aug. 24, 2018 in Korean Patent Application No. 10-2018-0034368.
U.S. Corrected Notice of Allowance dated Dec. 5, 2018 in U.S. Appl. No. 15/955,440.
U.S. Notice of Allowance dated Oct. 17, 2018 in U.S. Appl. No. 15/955,440.
U.S. Office Action dated Aug. 14, 2018 in U.S. Appl. No. 15/955,440.
U.S. Appl. No. 15/955,440, filed Apr. 17, 2018, Dong Won Koo, et al., Samsung Electronics Co., Ltd.

* cited by examiner

[Fig. 2]

[Fig. 4]
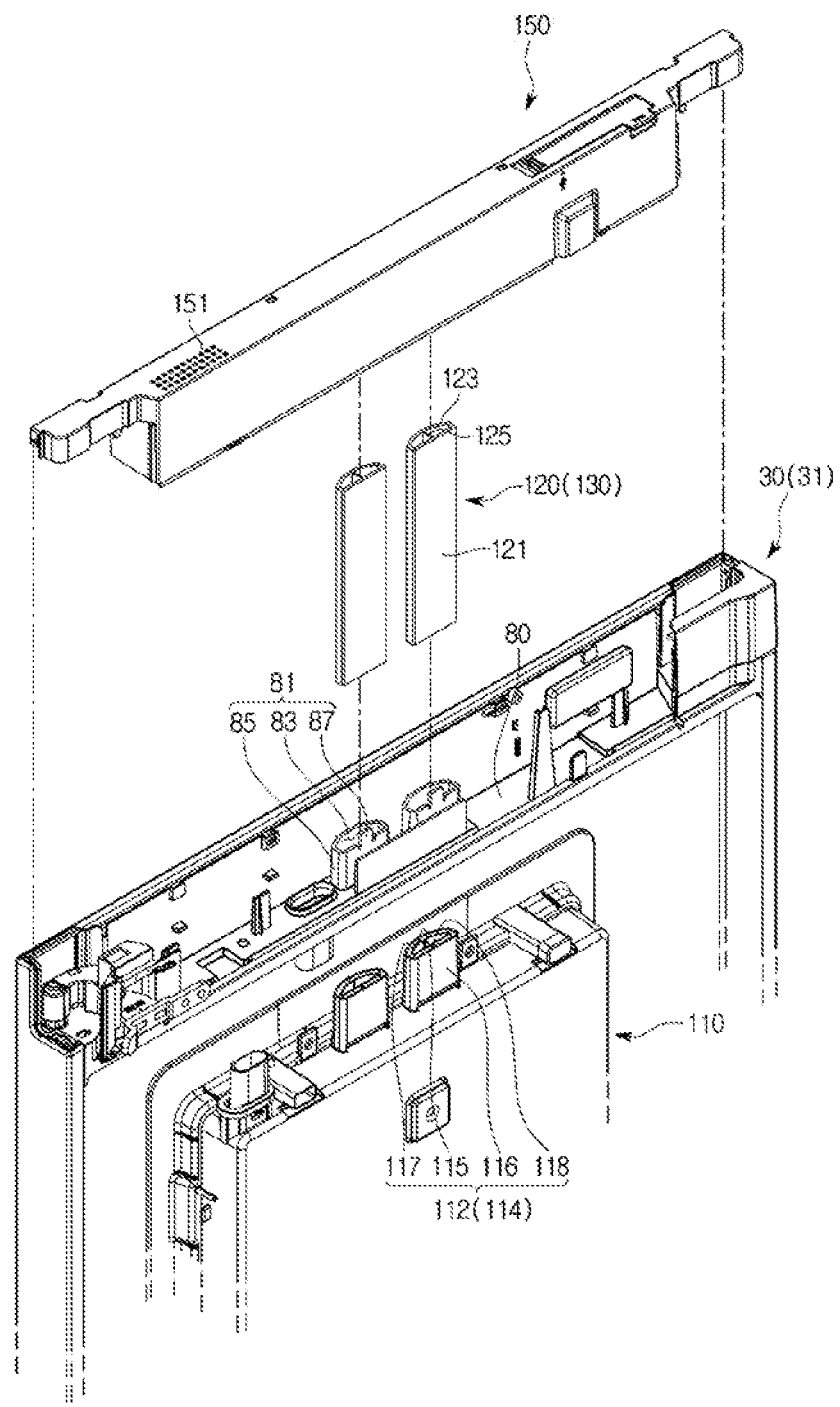

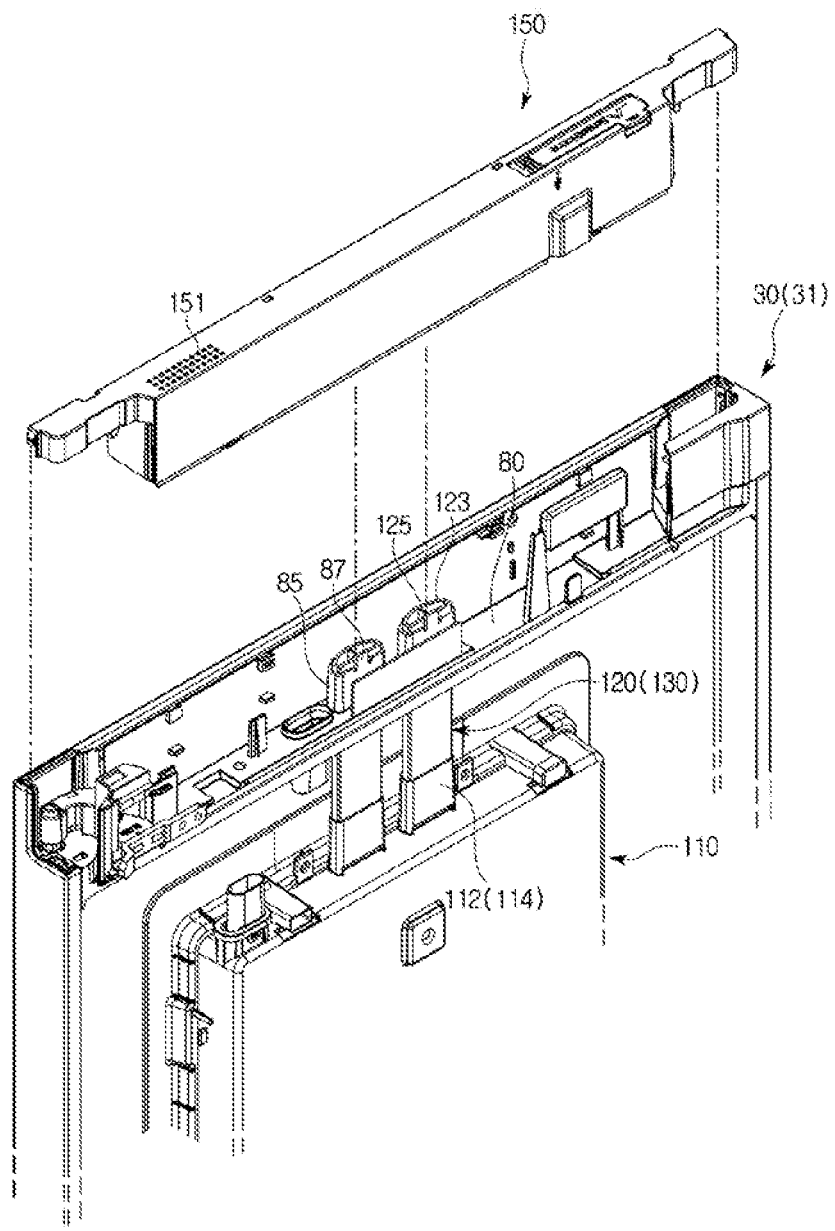
[Fig. 5]

[Fig. 6]
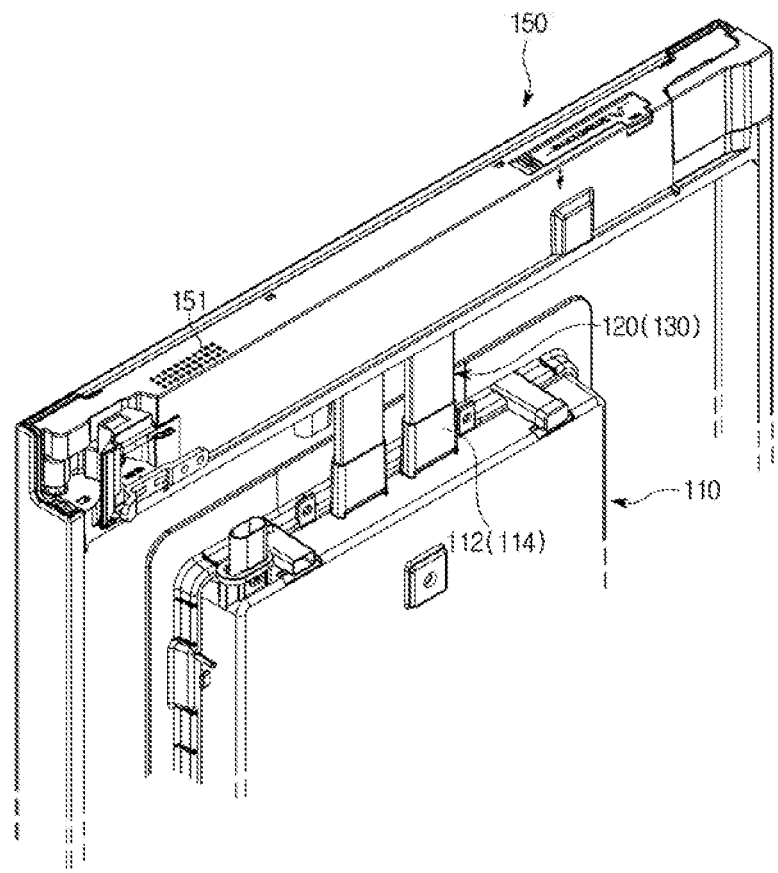
[Fig. 7]
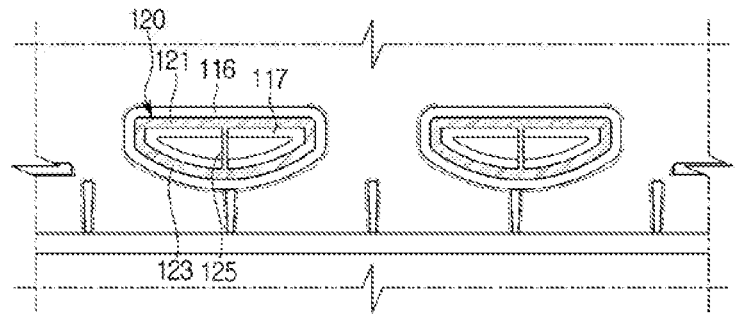

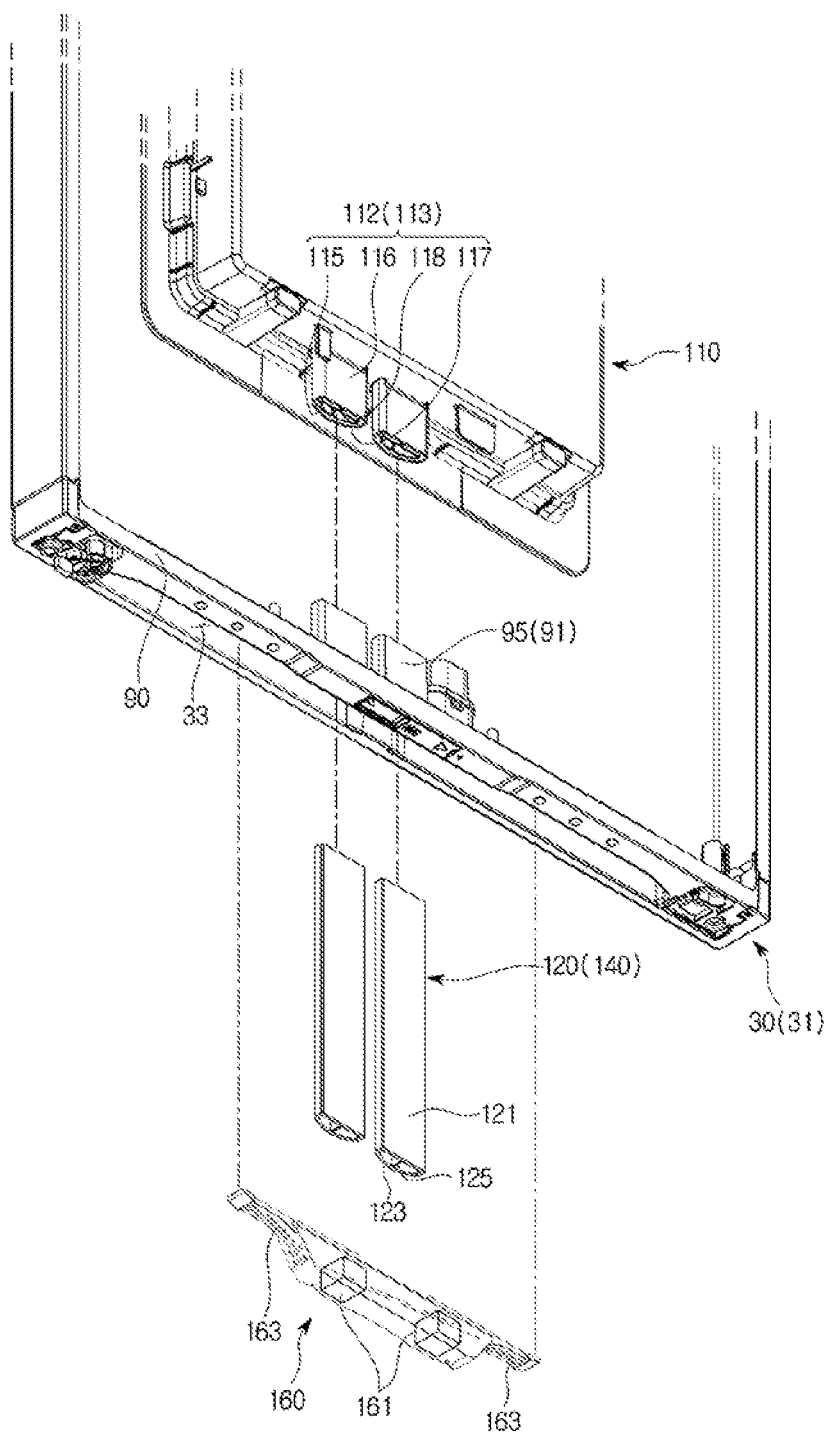

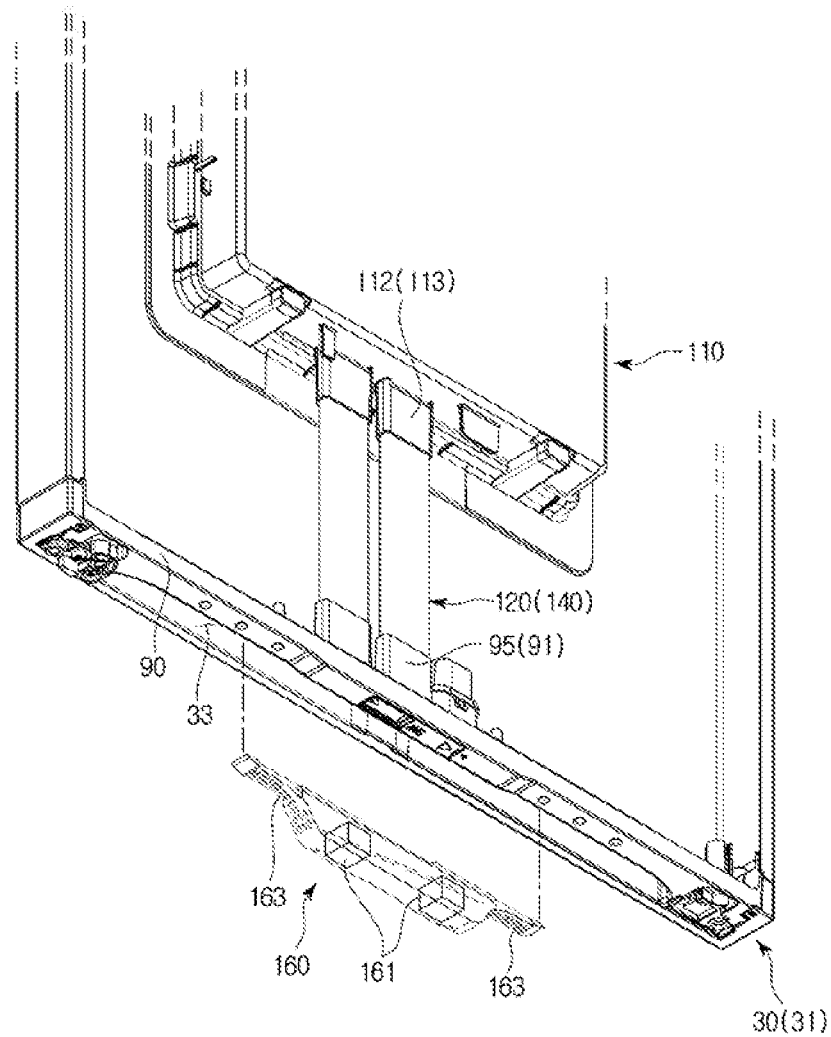

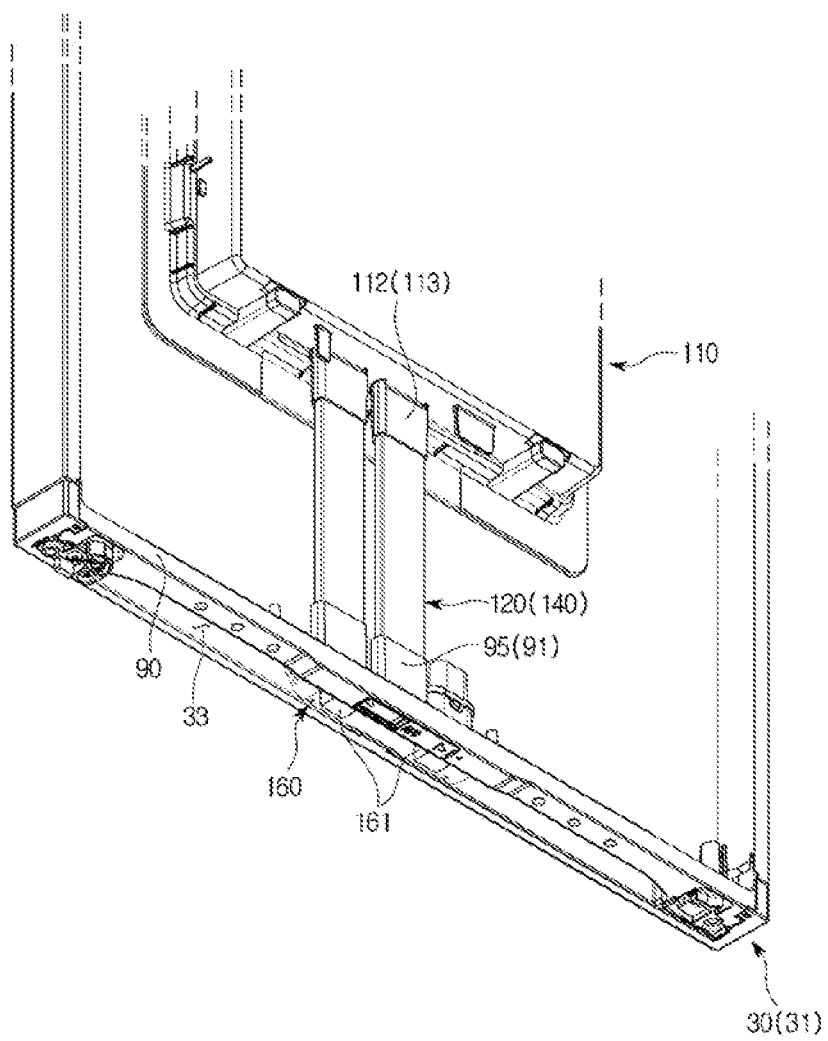

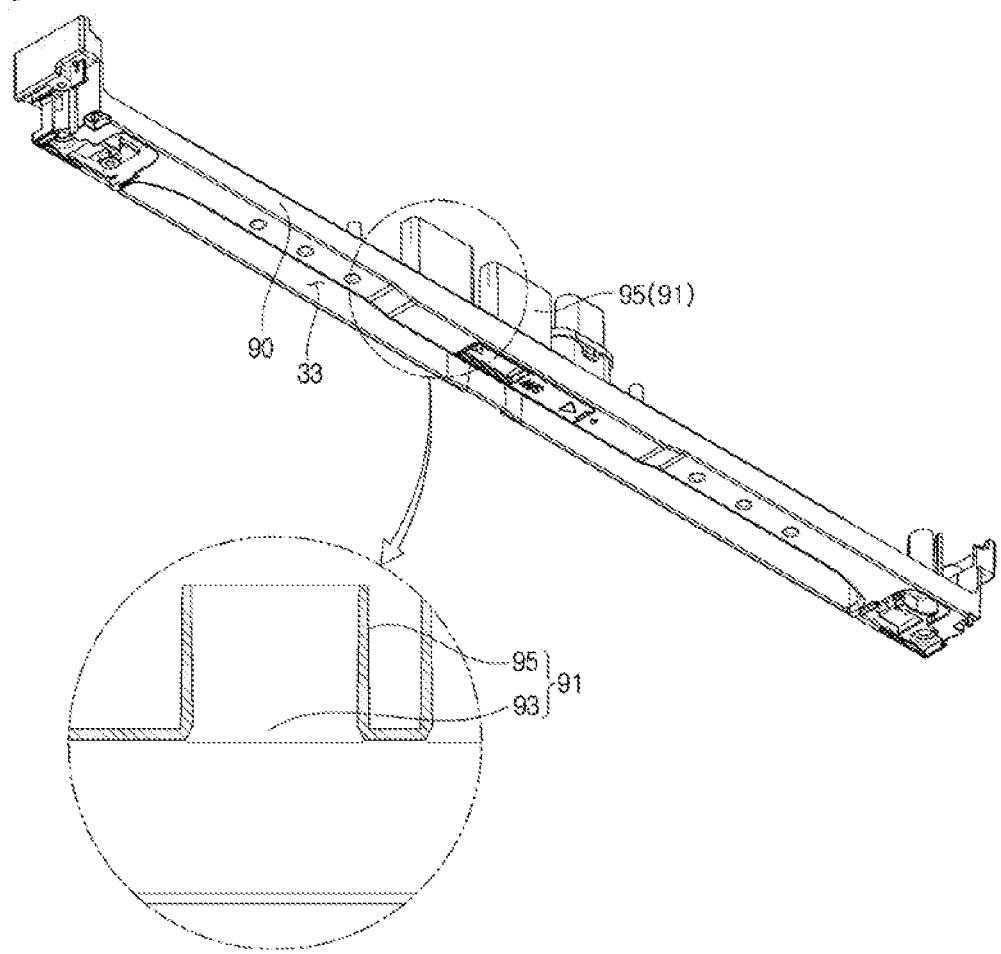
[Fig. 11]

REFRIGERATOR WITH A HEAT DISSIPATION DUCT FOR DISSIPATING HEAT GENERATED BY A DISPLAY

CROSS-REFERENCE TO RELATED APPLICATIONS

This application is a Continuation Application of U.S. patent application Ser. No. 15/955,440, filed on Apr. 17, 2018, which is a Continuation Application, filed under 35 U.S.C. § 111(a) of International Patent Application No. PCT/KR2017/005400 filed May 24, 2017, it being further noted that foreign priority benefit is based upon Korean Patent Application No. 10-2016-0096483 filed on Jul. 28, 2016. The contents of which are incorporated herein by reference.

TECHNICAL FIELD

The present disclosure relates to a refrigerator with an improved coupling structure of a heat dissipation duct for dissipating heat generated in a display unit.

BACKGROUND ART

Generally, a refrigerator is an apparatus for keeping food fresh at low temperature by supplying low-temperature cold air to a storage compartment in which the food is stored, and includes a freezing compartment maintained at a freezing temperature or lower and a refrigerating compartment maintained at a temperature slightly above the freezing temperature.

Types of refrigerators may be classified depending on forms of a storage compartment and a door, and may be classified as a top mounted freezer (TMF) type refrigerator in which a storage compartment is vertically divided by a horizontal partition, a freezing compartment is formed at an upper side, and a refrigerating compartment is formed at a lower side, and a bottom mounted freezer (BMF) type refrigerator in which a refrigerating compartment is formed at an upper side and a freezing compartment is formed at a lower side.

Also, there is a side-by-side (SBS) refrigerator in which a storage compartment is horizontally divided by a vertical partition, a freezing compartment is formed at one side, and a refrigerating compartment is formed at the other side, and there is a French door refrigerator (FDR) type refrigerator in which a storage compartment is vertically divided by a horizontal partition, a refrigerating compartment is formed at an upper side, a freezing compartment is formed at a lower side, and the refrigerating compartment at the upper side is opened or closed by a pair of doors.

A display unit configured to display operation information of a refrigerator or receive an operation command for the refrigerator is provided at a door of the refrigerator in some cases.

Heat is generated in the display unit during operation, and because the heat may deteriorate operational performance of the display unit and penetrate into a storage compartment to increase a temperature inside the storage compartment, it is preferable that the heat be dissipated to the outside.

Although a method in which heat generated in a display unit is conducted to a door of a refrigerator by using a heat dissipation plate has been recently proposed to solve this, heat dissipation efficiency is not satisfactory, and the heat may be transmitted to a user when the user comes into contact with the door.

Also, a method in which heat is released using a blower has been proposed, but there are problems in that noise is generated and a structure of a refrigerator including the blower is complex, and a method in which a heat dissipation duct for dissipating heat generated in a display unit is engaged with an inside of a refrigerator door has been proposed, but there is a problem in that assembling the heat dissipation duct is difficult.

One side of the heat dissipation duct is assembled to the inside of the refrigerator door by a hook and the like, and then the other side is rotated and assembled to the refrigerator door by a hook and the like, and the heat dissipation duct is engaged with the refrigerator door by an engaging member such as a screw when the heat dissipation duct is assembled to the refrigerator door by the hook and the like.

Because the heat dissipation duct is assembled by the hook and the like and then engaged with the refrigerator door by the engaging member such a screw, there are problems in that assembling the heat dissipation duct is difficult, and a separate sealing task for preventing penetration of a heat insulating material, with which the inside of the refrigerator door is filled, into the heat dissipation duct is required even after the heat dissipation duct is assembled.

DISCLOSURE

Technical Problem

It is an aspect of the present disclosure to provide a refrigerator with an improved coupling structure of a heat dissipation duct for dissipating heat generated in a display unit and having and applying the improved heat dissipation duct to a door having a thin thickness such that a problem in which a curve is generated at an exterior of a door when an inside of the door is filled with a heat insulating material is prevented.

Technical Solution

One aspect of the present disclosure provides a refrigerator including a main body having a storage compartment, and a door configured to open or close the storage compartment, wherein the door includes a door cap coupled to at least one of an upper portion and a lower portion of the door, a display unit provided at a front surface of the door, a heat dissipation cover arranged behind the display unit to form a heat dissipation flow path through which heat generated in the display unit is dissipated, and a heat dissipation duct slidably inserted into the door through the at least one of the upper portion and the lower portion of the door, to be seated between a coupling portion of the heat dissipation cover and an insertion portion of the door cap, wherein the coupling portion and the insertion portion extend lengthwise along the heat dissipation duct to accommodate the heat dissipation duct.

The heat dissipation duct may include a suction duct inserted into the lower portion of the door and coupled to a lower portion of the heat dissipation cover and a discharge duct inserted into the upper portion of the door and coupled to an upper portion of the heat dissipation cover.

Air inside the heat dissipation may flow path flows due to natural convection, and air outside the door may be suctioned through the suction duct, passes through the heat dissipation flow path, and be discharged to an outside of the door through the discharge duct.

Each of the suction duct and the discharge duct may include a rear surface portion in a planar shape and a round portion protruding from a front surface of the rear surface portion in a direction toward the front surface of the door.

Each of the suction duct and the discharge duct further may include a reinforcing rib provided between the rear surface portion and the round portion.

The coupling portion may include a first coupling portion formed at the lower portion of the heat dissipation cover and coupled to the suction duct and a second coupling portion formed at the upper portion of the heat dissipation cover and coupled to the discharge duct.

The first coupling portion and the second coupling portion may be formed to extend from the heat dissipation cover to respectively accommodate one ends of the suction duct and the discharge duct that are respectively inserted into the first coupling portion and the second coupling portion by being slid therein.

Each of the first coupling portion and the second coupling portion may include an insertion groove into which the one end of the suction duct or the discharge duct is inserted, a first supporter configured to support an outer portion of the suction duct or the discharge duct inserted into the insertion groove, and a second supporter configured to support an inner portion of the suction duct or the discharge duct inserted into the insertion groove.

The second supporter may include a coupling groove to which the reinforcing rib is fitted and coupled.

The door cap may include a lower door cap and an upper door cap coupled to the lower portion and the upper portion of the door, respectively, and the insertion portion may include a first inserting portion into which the suction duct is inserted, and the upper door cap includes a second inserting portion into which the discharge duct is inserted.

The first inserting portion may include a first insertion hole into which the suction duct is inserted and a first guide configured to guide the suction duct inserted into the first insertion hole to slide therethrough and formed to extend from the lower door cap to accommodate the other end of the suction duct.

The second inserting portion may include a second insertion hole into which the discharge duct is inserted and a second guide configured to guide the discharge duct inserted into the second insertion hole to slide therethrough and formed to extend from the upper door cap to accommodate the other end of the discharge duct.

The lower door cap may include a recessed portion having an upwardly-recessed shape and in which the first inserting portion is provided, and a lower cover formed of a transparent material, having a light emitting diode (LED) mounted therein, configured to cover the first inserting portion, and including a suction hole that allows the suction duct to communicate with the outside of the door is coupled to the recessed portion.

An upper cover configured to cover the second inserting portion may be coupled to the upper door cap, and the upper cover may include a discharge hole that allows the discharge duct to communicate with the outside of the door.

Advantageous Effects

According to embodiments of the present disclosure, by facilitating coupling of a heat dissipation duct and preventing generation of a curve at an exterior of a door due to the heat dissipation duct when an inside of the door is filled with a heat insulating material, the heat dissipation duct can be applied to a door having a thin thickness.

DESCRIPTION OF DRAWINGS

FIG. 4 is a view illustrating a state in which an upper cover and a discharge duct are disassembled according to an embodiment of the present disclosure.

FIG. 5 is a view illustrating a state in which the discharge duct illustrated in FIG. 4 is coupled to a heat dissipation cover.

FIG. 6 is a view illustrating a state in which the upper cover illustrated in FIG. 5 is coupled to an upper door cap.

FIG. 7 is a cross-sectional view illustrating a portion in which a heat dissipation duct is coupled to a coupling portion according to an embodiment of the present disclosure.

FIG. 8 is a view illustrating a state in which a lower cover and a suction duct are disassembled according to an embodiment of the present disclosure.

FIG. 9 is a view illustrating a state in which the suction duct illustrated in FIG. 8 is coupled to the heat dissipation cover.

FIG. 10 is a view illustrating a state in which the lower cover illustrated in FIG. 9 is coupled to a lower door cap.

FIG. 11 is a view illustrating a lower door cap and a cross-section of a first inserting portion provided at the lower door cap according to an embodiment of the present disclosure.

MODES OF THE INVENTION

Figure 1:
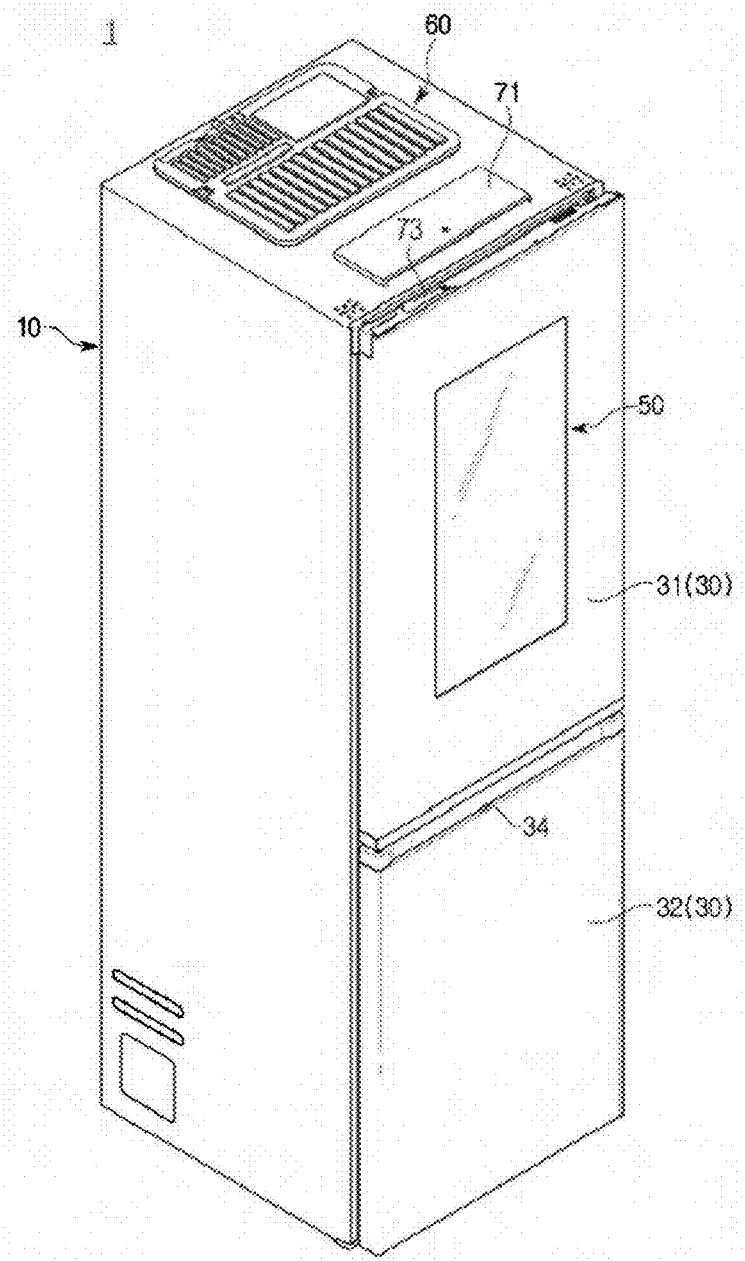
FIG. 1 is a perspective view of a refrigerator according to an embodiment of the present disclosure.

Embodiments described herein and configurations illustrated in the drawings are merely preferred examples of the present disclosure, and various modified examples that may replace the embodiments and the drawings of this specification may be present at the time of filing this application.

Like reference numerals or signs presented in each drawing of this specification represent parts or elements that perform substantially the same functions.

Terms used in this specification are used for describing the embodiments and are not intended to limit and/or restrict the present disclosure. A singular expression includes a plural expression unless clearly indicated otherwise. In this specification, terms such as "include," "have," or the like designate that features, number, steps, operations, elements, parts, or combinations thereof exist and do not preclude the existence of or the possibility of adding one or more other features, numbers, steps, operations, elements, parts, or combinations thereof in advance.

Terms including ordinals such as "first," "second," and the like used in this specification may be used to describe various elements, but the elements are not limited by the terms, and the terms are only used for the purpose of distinguishing one element from another element. For example, a second element may be referred to as a first element while not departing from the scope of the present disclosure, and likewise, a first element may also be referred to as a second element. The term "and/or" includes a combination of a plurality of related described items or any one item among the plurality of related described items.

Terms such as "front end," "rear end," "upper portion," "lower portion," "upper end," "lower end," and the like, when used in the description below, are defined on the basis of the drawings, and a shape and a position of each of the elements are not limited by the terms.

Generally, types of refrigerators may be classified depending on forms of a storage compartment and a door.

There are a top mounted freezer (TMF) type refrigerator in which a storage compartment is vertically divided by a horizontal partition, a freezing compartment is formed at an upper side, and a refrigerating compartment is formed at a lower side, and a bottom mounted freezer (BMF) type refrigerator in which a refrigerating compartment is formed at an upper side and a freezing compartment is formed at a lower side.

Also, there is a side-by-side (SBS) refrigerator in which a storage compartment is horizontally divided by a vertical partition, a freezing compartment is formed at one side, and a refrigerating compartment is formed at the other side, and there is a French door refrigerator (FDR) type refrigerator in which a storage compartment is vertically divided by a horizontal partition, a refrigerating compartment is formed at an upper side, a freezing compartment is formed at a lower side, and the refrigerating compartment at the upper side is opened or closed by a pair of doors.

Although a description of a BMF type refrigerator will be given in the present embodiment for convenience of description, embodiments are not limited thereto.

Hereinafter, embodiments according to the present disclosure will be described in detail with reference to the accompanying drawings.

Figure 2:
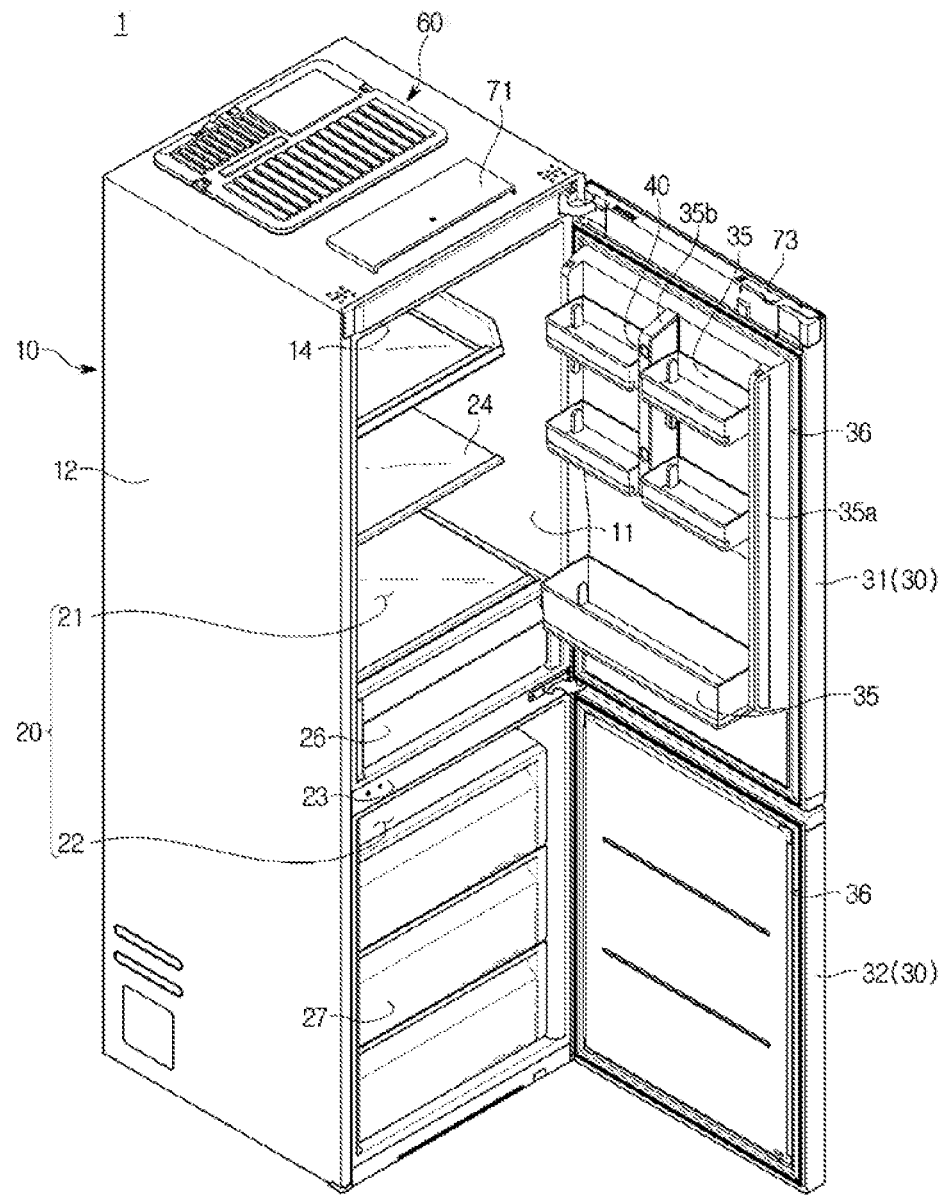
FIG. 2 is a perspective view illustrating a state in which a door of the refrigerator according to the embodiment of the present disclosure is open.

FIG. 1 is a perspective view of a refrigerator according to an embodiment of the present disclosure, and FIG. 2 is a perspective view illustrating a state in which a door of the refrigerator according to the embodiment of the present disclosure is open.

Referring to FIGS. 1 and 2, a refrigerator 1 may include a main body 10, a storage compartment 20 formed inside the main body 10 and having an open front surface, and a door 30 rotatably coupled to the main body 10 to open or close open front surfaces of storage compartments 21 and 22.

The main body 10 may form an exterior of the refrigerator 1. The main body 10 may include an inner case 11 forming the storage compartment 20 and an outer case 12 coupled to an outer side of the inner case 11 to form the exterior. Also, the main body 10 may include a cold air supply device (not illustrated) configured to supply cold air to the storage compartment 20.

The cold air supply device may include a compressor, a condenser, an expansion valve, an evaporator, a blower fan, a cold air duct, and the like. A heat insulating material 13 may fill a space between the inner case 11 and the outer case 12 of the main body 10 and an inside of the door 30 to prevent leakage of cold air from the storage compartment 20 (see FIG. 3).

A machine room (not illustrated) in which a compressor configured to compress refrigerant and a condenser configured to condense the compressed refrigerant are installed may be provided at a lower rear side of the main body 10.

An electronic component part 60 in which various electronic components for operating the refrigerator 1 are arranged may be provided at an upper side of the main body 10. The electronic component part 60 may be separated from the upper storage compartment 21 by a heat insulating partition (not illustrated) and prevent heat generated by the various electronic components arranged inside the electronic component part 60 from penetrating into the upper storage compartment 21.

The storage compartment 20 may be divided into the upper storage compartment 21 and the lower storage compartment 22 by a horizontal partition 23. Although the refrigerator 1 according to the embodiment of the present disclosure may be a BMF type refrigerator in which the upper storage compartment 21 is a refrigerating compartment and the lower storage compartment 22 is a freezing compartment, embodiments are not limited thereto, and the refrigerator 1 may also be a TMF type refrigerator in which the upper storage compartment 21 is a freezing compartment and the lower storage compartment 22 is a refrigerating compartment. However, description will be given on the basis of the BMF type refrigerator for convenience of description.

Shelves 24 on which food can be placed, an airtight container 25 configured to hermetically store food, and a drawer 26 slid to be withdrawn from the upper storage compartment 21 or inserted into the upper storage compartment 21 may be provided in the upper storage compartment 21. A drawer 27 slid to be withdrawn from the lower storage compartment 22 or inserted into the lower storage compartment 22 may be provided in the lower storage compartment 22.

The storage compartment 20 may have the open front surface so that food can be put therein and taken out, and the open front surface may be opened or closed by the door 30.

The upper storage compartment 21 may be opened or closed by an upper door 31 rotatably connected to the main body 10. The lower storage compartment 22 may be opened or closed by a lower door 32 rotatably connected to the main body 10.

Door shelves 35 on which food can be stored may be provided at a back surface of the upper door 31.

The back surface of the upper door 31 may include a first shelf supporter 35a vertically extending to support at least one side of both left and right sides of the door shelves 35. The first shelf supporter 35a may also be separably provided at the upper door 31 as a separate configuration, but is provided to extend from the back surface of the upper door 31 in the present embodiment.

Further, the back surface of the upper door 31 may include a second shelf supporter 35b vertically extending at an approximately central portion. Due to this configuration, the door shelves 35 may be arranged in parallel at the back surface of the upper door 31 or may be arranged to be horizontally asymmetrical with respect to the second shelf supporter 35b. A camera 40 may be provided in the second shelf supporter 35b so that an inside of the upper storage compartment 21 can be captured.

The upper door 31 may include an upper handle 33 provided at a lower end portion thereof. A user may grip the upper handle 33 and easily open or close the upper door 31. The upper handle 33 may extend in a horizontal direction of the upper door 31 and may be formed in a shape recessed toward an inside of the upper door 31, but the shape of the upper handle 33 is not limited thereto, and the upper handle 33 may have any shape as long as the shape can be easily gripped by the user.

The lower door 32 may include a lower handle 34 provided at an upper end portion. The user may grip the lower handle 34 and easily open or close the lower door 32. The lower handle 34 may extend in a horizontal direction of the lower door 32 and may be formed in a shape recessed toward an inside of the lower door 32, but the shape of the lower handle 34 is not limited thereto, and the lower handle 34 may have any shape as long as the shape can be easily gripped by the user.

Gaskets 36 may be provided at edges of back surfaces of the upper door 31 and the lower door 32 to seal gaps between the doors and the main body 10 in a state in which the upper door 31 and the lower door 32 are closed. The gaskets 36 may be installed in the shape of a loop along the edges of the back surfaces of the upper door 31 and the lower door 32, and magnets (not illustrated) may be included therein.

The refrigerator 1 according to the embodiment of the present disclosure may further include a display unit 50 having an input/output function. The display unit 50 may be installed at the upper door 31 for convenience of a user. A heat dissipation unit 100 for dissipating heat generated in the display unit 50 may be provided behind the display unit 50 (see FIG. 3). The heat dissipation unit 100 will be described in detail below.

A speaker assembly (not illustrated) which outputs an operation of the refrigerator 1 due to the display unit 50 by voice may be provided at a front portion of the upper side of the main body 10, and an upper portion of the speaker assembly may be covered by a cover member 71.

A Universal Serial Bus (USB) connection unit 73 connected to the display unit 50 and to which a USB (not illustrated) capable of outputting an image on the display unit 50 is connected may be provided at an upper end of the upper door 31.

Next, the heat dissipation unit will be described in detail with reference to FIGS. 3 to 11.

Figure 3:
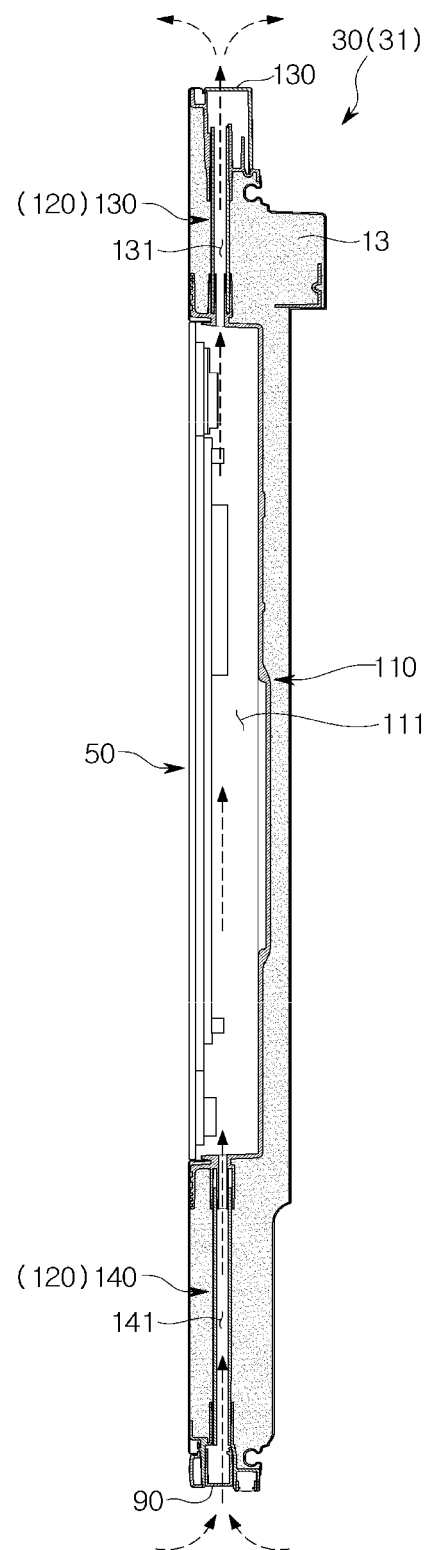
FIG. 3 is a cross-sectional view illustrating an upper door of the refrigerator according to the embodiment of the present disclosure.

FIG. 3 is a cross-sectional view illustrating an upper door of the refrigerator according to the embodiment of the present disclosure, FIG. 4 is a view illustrating a state in which an upper cover and a discharge duct are disassembled according to an embodiment of the present disclosure, FIG. 5 is a view illustrating a state in which the discharge duct illustrated in FIG. 4 is coupled to a heat dissipation cover, FIG. 6 is a view illustrating a state in which the upper cover illustrated in FIG. 5 is coupled to an upper door cap, and FIG. 7 is a cross-sectional view illustrating a portion in which a heat dissipation duct is coupled to a coupling portion according to an embodiment of the present disclosure.

As illustrated in FIGS. 3 to 7, the heat dissipation unit 100 for dissipating the heat generated in the display unit 50 is arranged behind the display unit 50 inside the upper door 31.

The heat dissipation unit 100 includes a heat dissipation cover 110 arranged behind the display unit 50 and a heat dissipation duct 120 coupled to an upper portion and a lower portion of the heat dissipation cover 110.

The heat dissipation cover 110 is preferably provided to have a size corresponding to the display unit 50, and a heat dissipation flow path 111 for dissipating the heat generated in the display unit 50 is formed inside the heat dissipation cover 110.

Coupling portions 112 to which the heat dissipation duct 120 is coupled are provided at the upper portion and the lower portion of the heat dissipation cover 110, and the coupling portions 112 include a first coupling portion 113 provided at the lower portion of the heat dissipation cover 110 and a second coupling portion 114 provided at the upper portion thereof.

A suction duct 140 of the heat dissipation duct 120 into which outside air is suctioned is coupled to the first coupling portion 113, and a discharge duct 130 of the heat dissipation duct 120 through which air inside the heat dissipation flow path 111 is discharged to the outside is coupled to the second coupling portion 114.

A detailed structure of the coupling portion 112 will be described with a description of the heat dissipation duct 120 below.

The heat dissipation duct 120 includes the discharge duct 130 coupled to the upper portion of the heat dissipation cover 110 and in which a discharge flow path 131 is formed, and the suction duct 140 coupled to the lower portion of the heat dissipation cover 110 and in which a suction flow path 141 is formed.

Although structures of the discharge duct 130 and the suction duct 140 are the same, the discharge duct 130 and the suction duct 140 are nominally distinguished because the discharge duct 130 and the suction duct 140 either suction or discharge air according to coupling positions thereof.

Although a plurality of discharge ducts 130 and a plurality of suction ducts 140 are provided and two discharge ducts 130 and two suction ducts 140 are illustrated in the drawings, embodiments are not limited thereto, and a single discharge duct 130 and a single suction duct 140 may be provided, or three or more discharge ducts 130 and three or more suction ducts 140 may be provided.

The heat dissipation duct 120 includes a rear surface portion 121 in a planar shape and a round portion 123 protruding from a front surface of the rear surface portion 121 in a direction toward a front surface of the upper door 31.

The round portion 123 is provided at the front surface of the rear surface portion 121 to have a round cross-section to maximally secure a space, which can be filled with the heat insulating material 13, between the front surface of the upper door 31 forming an exterior thereof and the heat dissipation duct 120 when the inside of the upper door 31 is filled with the heat insulating material 13.

Because the heat insulating material 13 is hardened and contracted after being filled in the space, the above prevents a curve from being generated at the front surface of the upper door 31 forming the exterior due to the contraction of the heat insulating material 13 when the space filled with the heat insulating material 13 is narrow.

Although there is no problem in the case in which a thickness of the upper door 31 is thick because the space filled with the heat insulating material 13 can be sufficiently secured, because it is difficult to sufficiently secure the space filled with the heat insulating material 13 in the case in which the thickness of the upper door 31 is thin, the space filled with the heat insulating material 13 can be maximally secured only when the round portion 123 is formed in the heat dissipation duct 120.

A reinforcing rib 125 configured to reinforce strength at a portion with a largest width among the flow paths 131 and 141, which are formed inside the heat dissipation duct 120, may be provided between the rear surface portion 121 and the round portion 123.

The discharge duct 130 of the heat dissipation duct 120 is inserted into the upper door 31 through the upper portion of the upper door 31, and is coupled to the upper portion of the heat dissipation cover 110.

An upper door cap 80 is coupled to the upper portion of the upper door 31, and the upper door cap 80 includes a second inserting portion 81 into which the discharge duct 130 is inserted.

A number of second inserting portions 81 corresponding to the number of discharge ducts 130 are provided, and the second inserting portion 81 includes a second insertion hole 83 into which the discharge duct 130 is inserted and a second guide 85 configured to guide the discharge duct 130 inserted into the second insertion hole 83 to slide in a vertical direction.

The second guide 85 may be provided to extend downward from the second insertion hole 83.

A fixing hook 87 configured to fix the discharge duct 130 inserted into the second insertion hole 83 may be provided at one side of the second insertion hole 83.

A lower end portion of the discharge duct 130 inserted through the second inserting portion 81 is coupled to the second coupling portion 114 provided at the upper portion of the heat dissipation cover 110.

The second coupling portion 114 includes an insertion groove 115 into which the lower end portion of the discharge duct 130 is inserted, a first supporter 116 configured to support an outer portion of the discharge duct 130 inserted into the insertion groove 115, and a second supporter 117 configured to support an inner portion of the discharge duct 130.

The insertion groove 115 is provided to have a shape corresponding to the rear surface portion 121 and the round portion 123 of the discharge duct 130.

The second supporter 117 configured to support the inner portion of the discharge duct 130 may include a coupling groove 118 to which the reinforcing rib 125 of the discharge duct 130 is fitted and coupled.

Because the second inserting portion 81 of the upper door cap 80 and the second coupling portion 114 of the heat dissipation cover 110 respectively accommodate the upper portion and the lower portion of the discharge duct 130 to block the upper portion and the lower portion from the space filled with the heat insulating material 13, leakage of the heat insulating material 13 to the outside can be prevented without a separate sealing task.

An upper cover 150 configured to cover the second inserting portion 81 to block the second inserting portion 81 from the outside is coupled to the upper door cap 80, and discharge holes 151 that allow the discharge flow path 131 of the discharge duct 130 to communicate with an outside of the upper door 31 are provided in the upper cover 150.

Because the second inserting portion 81 is blocked from the outside by the upper cover 150, penetration of foreign substances into the discharge duct 130 inserted into the second inserting portion 81 can be prevented.

FIG. 8 is a view illustrating a state in which a lower cover and a suction duct are disassembled according to an embodiment of the present disclosure, FIG. 9 is a view illustrating a state in which the suction duct illustrated in FIG. 8 is coupled to the heat dissipation cover, FIG. 10 is a view illustrating a state in which the lower cover illustrated in FIG. 9 is coupled to a lower door cap, and FIG. 11 is a view illustrating a lower door cap and a cross-section of a first inserting portion provided at the lower door cap according to an embodiment of the present disclosure.

As illustrated in FIGS. 8 to 11, the suction duct 140 of the heat dissipation duct 120 is inserted into the upper door 31 through the lower portion of the upper door 31 and coupled to the lower portion of the heat dissipation cover 110.

Because the structure of the suction duct 140 is the same as that of the discharge duct 130, a description thereof will be omitted.

A lower door cap 90 is coupled to the lower portion of the upper door 31, and the lower door cap 90 includes a first inserting portion 91 into which the suction duct 140 is inserted.

A number of first inserting portions 91 corresponding to the number of suction ducts 140 are provided, and the first inserting portion 91 includes a first insertion hole 93 into which the suction duct 140 is inserted and a first guide 95 configured to guide the suction duct 140 inserted into the first insertion hole 93 to slide in the vertical direction.

The first guide 95 may be provided to extend upward from the first insertion hole 93.

An upper end portion of the suction duct 140 inserted through the first inserting portion 91 is coupled to the first coupling portion 113 provided at the lower portion of the heat dissipation cover 110.

Because a structure of the first coupling portion 113 is the same as that of the second coupling portion 114, a description thereof will be omitted.

Because the first inserting portion 91 of the lower door cap 90 and the first coupling portion 113 of the heat dissipation cover 110 respectively accommodate the lower portion and the upper portion of the suction duct 140 to block the lower portion and the upper portion from the space filled with the heat insulating material 13, leakage of the heat insulating material 13 to the outside can be prevented without a separate sealing task.

The lower door cap 90 includes a recessed portion having an upwardly-recessed shape, and the first inserting portion 91 is provided at the recessed portion.

The recessed portion forms the upper handle 33 of the upper door 31.

A lower cover 160 configured to cover the first inserting portion 91 to block the first inserting portion 91 from the outside is coupled to the lower door cap 90, a light emitting diode (LED) 161 that is lit according to an opening and closing of the lower door 32 is mounted in the lower cover 160, and suction holes 163 that allow the suction flow path 141 of the suction duct 140 to communicate with the outside of the upper door 31 are provided in the lower cover 160.

Both side portions of the lower cover 160 are provided to have a round shape so that the recessed portion forming the upper handle 33 of the upper door 31 forms the largest possible space and a user can easily grip the upper handle 33, and the suction holes 163 may be provided at both of the side portions of the lower cover 160.

Because the first inserting portion 91 is blocked from the outside by the lower cover 160, penetration of foreign substances into the suction duct 140 inserted into the first inserting portion 91 can be prevented.

The lower cover 160 may be formed of a transparent material so that light is emitted to an outside of the lower cover 160 when the LED 161 mounted in the lower cover 160 is lit according to the opening and closing of the lower door 32.

Although it is illustrated in the drawings that the lower cover 160 is coupled and accommodated in the recessed portion forming the upper handle 33 of the upper door 31 and light emitted by the LED 161 is emitted downward from the upper door 31, embodiments are not limited thereto, and the light emitted by the LED 161 may also be emitted forward from the upper door 31.

Next, a process in which the heat dissipation duct is coupled to the heat dissipation cover will be described.

As illustrated in FIG. 4, when the discharge duct 130 is inserted through the second inserting portion 81 of the upper door cap 80 in a state in which the upper door cap 80 is coupled to the upper portion of the upper door 31, the discharge duct 130 slides downward, and the lower end portion of the discharge duct 130 is coupled to the second coupling portion 114 of the heat dissipation cover 110, as illustrated in FIG. 5.

Because the discharge duct 130 slides downward through the second inserting portion 81 to be coupled to the heat dissipation cover 110, the discharge duct 130 can be easily coupled to the heat dissipation cover 110.

When the discharge duct 130 is coupled to the second coupling portion 114 of the heat dissipation cover 110, the upper cover 150 is coupled to the upper door cap 80, as illustrated in FIG. 6.

As illustrated in FIG. 8, when the suction duct 140 is inserted through the first inserting portion 91 of the lower door cap 90 in a state in which the lower door cap 90 is coupled to the lower portion of the upper door 31, the suction duct 140 slides upward, and the upper end portion of the suction duct 140 is coupled to the first coupling portion 113 of the heat dissipation cover 110, as illustrated in FIG. 9.

Because the suction duct 140 slides upward through the first inserting portion 91 to be coupled to the heat dissipation cover 110, the suction duct 140 can be easily coupled to the heat dissipation cover 110.

When the suction duct 140 is coupled to the first coupling portion 113 of the heat dissipation cover 110, the lower cover 160 is coupled to the lower door cap 90, as illustrated in FIG. 10.

Looking at a process in which the heat generated in the display unit 50 is dissipated by the heat dissipation unit 100, because air whose temperature is increased due to the display unit 50 flows upward in the heat dissipation flow path 111 formed inside the heat dissipation cover 110 as illustrated in FIG. 3, a lower portion of the heat dissipation flow path 111 should be supplemented with air.

Consequently, outside air is suctioned through the suction holes 163 provided in the lower cover 160, and the air suctioned into the suction holes 163 is supplied to the lower portion of the heat dissipation flow path 111 through the suction flow path 141 (see FIG. 9).

The air with an increased temperature that flows upward inside the heat dissipation flow path 111 is discharged to the outside of the heat dissipation flow path 111 through the discharge flow path 131 of the discharge duct 130, and the air discharged through the discharge flow path 131 is discharged to the outside of the upper door 31 through the discharge holes 151 of the upper cover 150 (see FIG. 6).

Because air outside the upper door 31 passes through the suction flow path 141 and is transmitted to the heat dissipation flow path 111 due to natural convection of air and the air whose temperature is increased due to the display unit 50 is discharged to the outside of the upper door 31 through the discharge flow path 131 due to the outside air being transmitted to the heat dissipation flow path 111, the heat generated in the display unit 50 may be dissipated to the outside without being transmitted to the storage compartment 20.

Although description has been given mainly on the basis of particular shapes and directions in the above description of the refrigerator with reference to the accompanying drawings, various modifications and changes may be made by one of ordinary skill in the art, and such modifications and changes should be construed as belonging to the scope of the present disclosure.

The invention claimed is:

1. A refrigerator comprising:
a main body having a storage compartment; and
a door configured to open or close the storage compartment,
wherein the door includes:
a display provided at a front surface of the door; and
a heat dissipation unit to dissipate heat generated in the display,
the heat dissipation unit includes:
a heat dissipation cover arranged behind the display to form a heat dissipation flow path; and
a heat dissipation duct coupled to an upper portion and a lower portion of the heat dissipation cover to allow the heat dissipation flow path to communicate with the outside of the door, and including a round portion protruding in a direction toward the front surface of the door and a rear surface portion disposed to face the round portion;
wherein at least a portion of the heat dissipation duct is arranged so that a front surface and a rear surface thereof are in contact with a heat insulating material and includes a reinforcing rib extending to connect the round portion and the rear surface portion.

2. The refrigerator of claim 1, wherein the heat dissipation duct includes:
a plurality of suction ducts coupled to the lower portion of the heat dissipation cover to form a suction flow path that allows the heat dissipation flow path to communicate with the outside of the door, and
a plurality of discharge ducts coupled to the upper portion of the heat dissipation cover to form a discharge flow path that allows the heat dissipation flow path to communicate with the outside of the door.

3. The refrigerator of claim 2, wherein the heat dissipation cover is arranged between the display and a portion of the heat insulating material with which an inside of the door is filled.

4. The refrigerator of claim 3, wherein the plurality of suction ducts are formed to slide into the door through a lower portion of the door and be coupled to the lower portion of the heat dissipation cover, and
the plurality of discharge ducts are formed to slide into the door through an upper portion of the door and be coupled to the upper portion of the heat dissipation cover.

5. The refrigerator of claim 1, wherein a size of the heat dissipation cover is equal to a size of the display, and the heat dissipation flow path is formed inside the heat dissipation cover.

6. The refrigerator of claim 1, wherein the round portion of the heat dissipation duct is the at least a portion of the heat dissipation duct contacting with the heat insulating material.

* * * * *